(12) United States Patent
Schoeber

(10) Patent No.: US 6,912,681 B1
(45) Date of Patent: Jun. 28, 2005

(54) CIRCUIT CELL FOR TEST PATTERN GENERATION AND TEST PATTERN COMPRESSION

(75) Inventor: Volker Schoeber, München (DE)

(73) Assignee: Infineon Technologies AG, Munich (DE)

( * ) Notice: Subject to any disclaimer, the term of this patent is extended or adjusted under 35 U.S.C. 154(b) by 494 days.

(21) Appl. No.: 10/110,554
(22) PCT Filed: Oct. 10, 2000
(86) PCT No.: PCT/EP00/09963
§ 371 (c)(1),
(2), (4) Date: Aug. 27, 2002
(87) PCT Pub. No.: WO01/27761
PCT Pub. Date: Apr. 19, 2001

(30) Foreign Application Priority Data

Oct. 11, 1999 (DE) .......................... 199 48 902

(51) Int. Cl.[7] .......................... G01R 31/28; G06F 11/00
(52) U.S. Cl. .................. 714/738; 714/733; 324/73.1
(58) Field of Search .......................... 714/43, 724–738; 324/73.1

(56) References Cited

U.S. PATENT DOCUMENTS 4,740,970 A    4/1988  Burrows et al.
5,083,049 A    1/1992  Kagey
5,602,855 A    2/1997  Whetsel, Jr.
6,223,312 B1 * 4/2001  Nozuyama .................. 714/724
6,237,122 B1 * 5/2001  Maki .......................... 714/730
6,662,326 B1 * 12/2003 Schober ..................... 714/733

FOREIGN PATENT DOCUMENTS

DE    42 21 435    5/1994

* cited by examiner

Primary Examiner—Albert Decady
Assistant Examiner—Cynthia Britt
(74) Attorney, Agent, or Firm—Schiff Hardin LLP

(57) ABSTRACT

A circuit for test pattern generation compression of circuits with a built-in self-test function has a test data coupling circuit having a test data input for receiving a test data input signal from a circuit cell connected upstream, which signal can be stored in a test data buffer store, a data input for applying a data input signal, which can be stored in a buffer store, a test data output for outputting the buffer-stored test data signal, and a data output for outputting the buffer-stored data signal to a data signal path via a data signal output of the circuit cell, the two buffer stores of the test data coupling circuit having a common feedback signal path, via which the received test data input signal can be coupled into the data signal path depending on a first control signal applied to the test data coupling circuit.

16 Claims, 4 Drawing Sheets

Prior Art

CIRCUIT CELL FOR TEST PATTERN GENERATION AND TEST PATTERN COMPRESSION

BACKGROUND OF THE INVENTION

1. Field of the Invention

The invention relates to a circuit cell for test pattern generation and test pattern compression in integrated circuits with a built-in self-test function.

2. Description of the Related Art

U.S. Pat. No. 4,740,970 describes a circuit arrangement for use in an integrated circuit with built-in self-test logic. In order to extend possible operating modes of a BILBO (Built In Logic Block Observation) register cell, a multiplexer is provided which is driven by an additional control signal. Depending on the control signal, the multiplexer applies either a data input signal DI or a data output signal DO, which is buffer-stored, to an AND gate, the data output signal DO being fed back via a feedback line from a D flip-flop, which forms a data buffer store, to the multiplexer.

German Patent document DE 42 21 435 C2 describes an electronic module with a clock-controlled shift register test architecture. In the test device, an additional operating mode can be activated in which at least one sequence of a few register elements form a feedback shift register which is designed for generating a bit pattern sequence which has a width of n bits or for signature formation from a bit pattern sequence which has a width of n bits and is fed to the register elements on the module terminal side. In this case, a boundary scan cell is extended in such a way that it can be arranged for test pattern generation or for signature formation as a feedback shift register.

After fabrication, integrated circuits are subjected to a test method for testing their logical and dynamic behavior. This serves, on the one hand, to identify defective circuits and, on the other hand, to test the performance of the integrated circuits using the test results. In this case, the integrated circuits comprise multiple logic components which, for their part, comprise switching elements or transistors. Highly complex integrated circuits have multiple switching elements or transistors. In known test methods, stimulation test patterns are applied to the integrated circuits by an automatic test machine and response test patterns at the outputs of the integrated circuits are read out by the automatic test machine and compared with a desired test response. The test response pattern which is output by the circuit to be examined (the Device Under Test, or "DUT") must correspond to the desired test response in order to identify that the integrated circuit is defect-free.

Integrated circuits are increasingly being constructed as BIST (Built-In Self-Test) structures with a built-in self test, i.e., logic comprising test pattern generators and test data evaluation modules are additionally implemented in the integrated circuit.

In order to facilitate test methods, these integrated circuits to be tested are increasingly being formed modularly from a multiplicity of circuit units that can be tested separately and are connected to one another via a data bus.

FIG. 1 schematically shows the construction of a known integrated circuit with a built-in self-test function which is constructed modularly from a multiplicity of circuit modules SM. Each circuit module SM comprises the actual logic circuit to be tested (DUT) and additionally comprises two BILBO registers, the first of the two BILBO registers being connected to the logic inputs of the logic circuit to be tested (DUT) and the other BILBO register being connected to the logic outputs of the logic circuit to be tested DUT.

The BILBO registers R shown in FIG. 1 are connected to one another in a serial test path. In the example shown in FIG. 1, a test data input signal TDI is applied to the register $R_{i,E}$, which is connected to the logic inputs of the logic circuit to be tested DUT of the circuit module i, and a test data output signal TDO is read out at the register $R_{i,A}$ of the circuit module i. The registers $R_{i,E}$ illustrated in FIG. 1, the register $R_{i+1,E}$, the register $R_{i+1,A}$, and the register $R_{i,A}$ are interconnected via lines to form a serial test path. The BILBO registers R are registers that can independently generate test patterns and/or compress test pattern data. Conventional BILBO registers can be changed over between different operating states. In a first normal operating state, the BILBO register functions as a latch, in which the data present on the parallel data bus are applied to the logic circuit to be tested DUT or are read out from the logic circuit to be tested DUT via the data bus. In a second operating state, the BILBO register operates as a serial shift register for an initialization of reading test data out and in. In a further operating state, test patterns are generated in the BILBO register and transmitted. In a fourth operating state, processed test pattern data are received and compressed for test pattern evaluation.

BILBO registers R are in each case formed by a multiplicity of serially cascaded circuit cells. In this case, a test data input of one BILBO circuit cell is in each case connected to the test data output of a BILBO circuit cell connected upstream.

FIG. 2 shows a known BILBO circuit cell for the construction of a BILBO register R according to the prior art. The BILBO circuit cell shown in FIG. 2 has two control signal inputs (B1, B2), a clock signal input (CLK), a data input (DI) and a test data input (TDI). The control signals (B1, B2) are generated by a control circuit for setting the operating state of the BILBO register R. The data input DI is connected to one of the parallel data lines of the internal data bus of the integrated circuit. The test data input TDI is in each case connected to the test data output of the preceding BILBO circuit cell, a serial test data input signal being applied to the test data input of the first BILBO circuit cell for test purposes. The BILBO circuit cell according to the prior art as shown in FIG. 2 contains, on the one hand, a logic circuit constructed from logic gates and a flip-flop FF constructed from two latch circuits $L_1$, $L_2$. In this case, the logic circuit comprises a NOR gate, which logically NORs the second control signal B2 with the signal present at serial test data signal input TDI, an AND gate, which logically ANDs the data input signal present at the data input DT with the first control signal B1, the outputs of the NOR gate and of the AND gate in each case being applied to a signal input of an XNOR gate, which logically combines the logic output signal of the NOR gate and the logic output signal of the AND gate in an XNOR operation and applies the resulting signal to the input of the first latch L1 of the flip-flop FF. The two latch circuits $L_1$, $L_2$ of the flip-flop FF are clocked using the clock signal present at the clock signal input CLK, the second latch circuit $L_2$ of the flip-flop receiving a clock signal which is inverted (by an inverter 1) relative to the clock signal present at the latch circuit $L_1$.

FIG. 3 shows the internal construction of a known conventional latch circuit L according to the prior art in detail. The latch circuit L has a multiplexer MUX with two signal inputs and a signal output. At the first input of the multiplexer MUX, the latch circuit receives a data input signal, which is switched through to the output a of the multiplexer MUX in a manner clocked by the clock signal present at the clock signal input. The output a of the multiplexer is fed back via two inverters $I_1$, $I_2$ for holding the input signal to the second input $e_2$ of the multiplexer MUX. The latch circuit L is clock-state-controlled, in which case, upon activation of the clock signal CLK, the bit present at the input $e_1$ is transferred to the output a and, at the same time, is stored statically in the feedback loop.

The logic circuit which is illustrated in FIG. 2 and forms a part of the BILBO circuit cell according to the prior art and comprises the NOR gate, the AND gate and also the XNOR gate corresponds functionally to an XOR gate with a multiplexer. In this case, the multiplexer is connected into the data signal path between the data signal input D1 and the data output DO of the circuit cell shown in FIG. 2. On account of the logic gates connected in the data signal path, propagation time signal delays occur in the circuit cell for a BILBO register as illustrated in FIG. 2, which delays increase the switching time of the circuit cell. Consequently, the logic circuit which is shown in FIG. 2 and serves for coupling the test data into the data signal path leads to an undesirable reduction of the switching speed of the BILBO register. The test operation for testing the integrated circuits is delayed considerably on account of the reduced switching speed of the BILBO registers.

SUMMARY OF THE INVENTION

Therefore, the object of the present invention is to provide a circuit cell for the construction of a register for test purposes which has a high switching speed.

This object is achieved according to the invention by a circuit cell having the features described below.

The invention provides a circuit cell for test pattern generation and test pattern compression in circuits with a built-in self-test function, the circuit cell having:

a test data coupling-in circuit with a test data input for receiving a test data input signal from a memory cell connected upstream, which signal can be stored in a test data buffer store, a data input for applying a data input signal which can be stored in a data buffer store, a test data output for outputting the buffer-stored test data signal, and having a data output for outputting the buffer-stored data signal to a data signal path via a data signal output of the memory cell, the two buffer stores of the test data coupling-in circuit having a common feedback signal path via which the received test data input signal can be coupled into the data signal path in a manner dependent on a first control signal applied to the test data coupling-in circuit, the circuit cell furthermore having a logical comparison circuit which compares the test data input signal with the test data signal output by the test data coupling-in circuit in order to generate a comparison signal which is output to a switching device which, in a manner dependent on a second control signal, switches through the generated comparison signal or the test data signal output by the test data coupling-in circuit to a test data signal output of the memory cell.

The basic idea in the case of the circuit cell according to the invention is that the test data are coupled into the data signal path via a common feedback signal path of two buffer stores and the number of circuit components that are serially cascaded into the data signal path is thus minimized in order to reduce the signal propagation time delay.

In a preferred development of the circuit cell according to the invention, the test data signal output of one circuit cell is in each case connected to the test data input of a circuit cell connected downstream for the purpose of constructing one BILBO register.

The two buffer stores of the test data coupling-in circuit are preferably latch circuits each comprising a multiplexer and a feedback multiplexer for feeding back the signal outputs of the multiplexers to a signal input of the multiplexer.

The feedback multiplexer preferably has two signal inputs, the first signal input being connected to the signal output of the multiplexer of the test data buffer store and the second signal input being connected to the signal output of the multiplexer of the data buffer store, and the feedback multiplexer being controllable by the first control signal in such a way that the output of the multiplexer of the test data buffer store is switched to a signal input of the multiplexer of the data buffer store for coupling the test data into the data signal path.

In a preferred development of the circuit cell according to the invention, the multiplexer of the test data buffer store has two switchable signal inputs, the test data input signal being present at the first signal input and the second signal input being connected to the signal output of the feedback multiplexer.

In accordance with a further preferred development of the circuit cell according to the invention, the multiplexer of the data buffer store has two switchable signal inputs, the data signal being present at the first signal input and the second signal input being connected to the signal output of the feedback multiplexer.

In a preferred development, the logical comparison circuit of the circuit cell is formed by an XOR gate.

In a preferred development of the circuit cell according to the invention, the switching device for switching through the generated comparison signal is formed by a multiplexer.

A clocked data output buffer store is preferably provided between the data output of the test data coupling-in circuit and the data signal output of the circuit cell. Furthermore, a clocked test data output buffer store is preferably provided between the test data output of the memory cell and the switching device.

In a preferred development of the circuit cell according to the invention, the test data coupling-in circuit receives, via a clock signal input, a clock signal for clocking the two buffer store multiplexers and the feedback multiplexer.

In accordance with a preferred development, the data output buffer store and the test data output buffer store receive, via a clock signal input, a clock signal which is inverted with respect to the clock signal present at the clock input of the test data coupling-in circuit.

The test data input signal is preferably buffer-stored in a clocked test data input buffer store for comparison with the test data signal by the comparison circuit.

The data output buffer store, the test data output buffer store and the test data input buffer store are in each case preferably formed by a latch circuit containing a feedback multiplexer.

A preferred embodiment of the invention's circuit cell for test pattern generation and test pattern compression of circuits with a built-in self-test function is described below for the purpose of elucidating features that are essential to the invention.

DESCRIPTION OF THE DRAWINGS

The invention is described with reference to the following figures in which similar reference characters refer to similar elements.

DETAILED DESCRIPTION OF THE INVENTION

Figure 1:
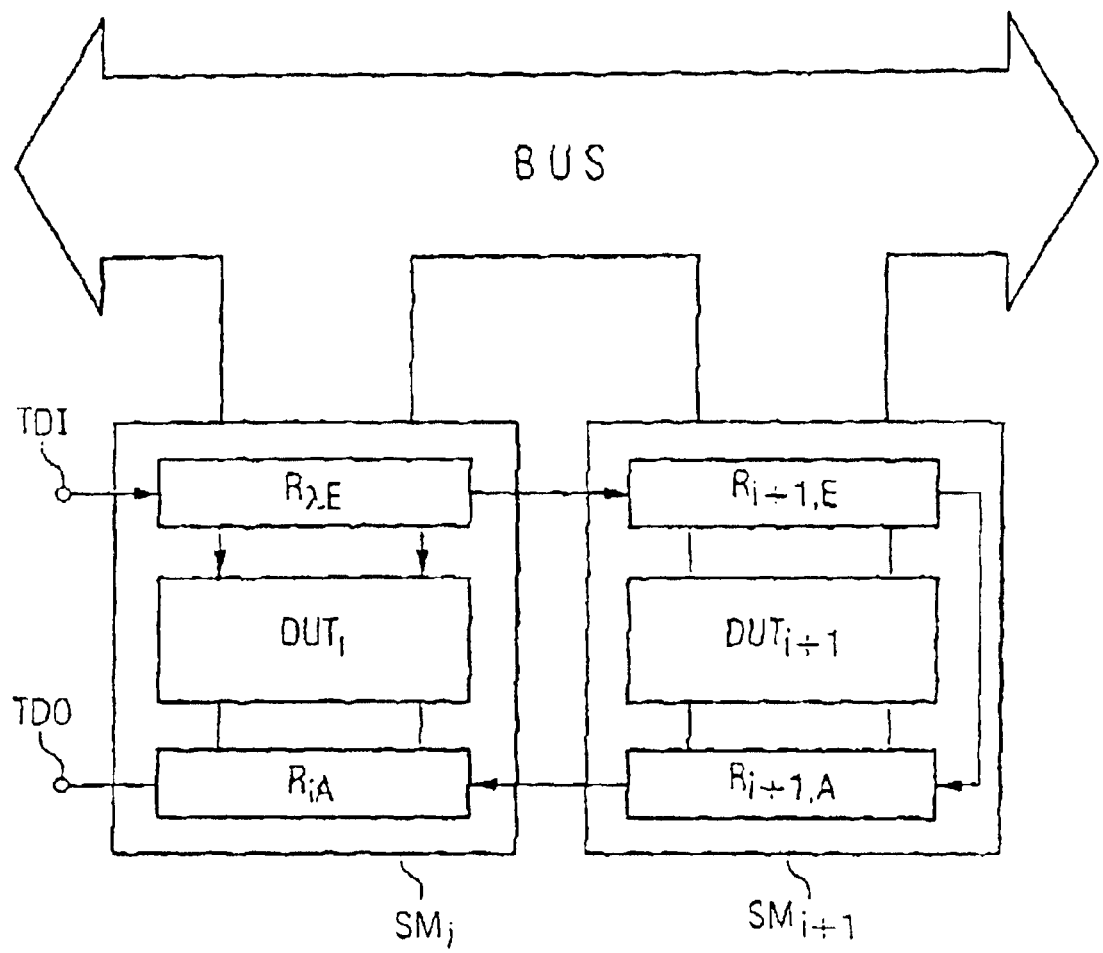
FIG. 1 is a schematic block diagram for elucidating the internal construction of an integrated circuit with a built-in self-test function according to the prior art.
Figure 2:
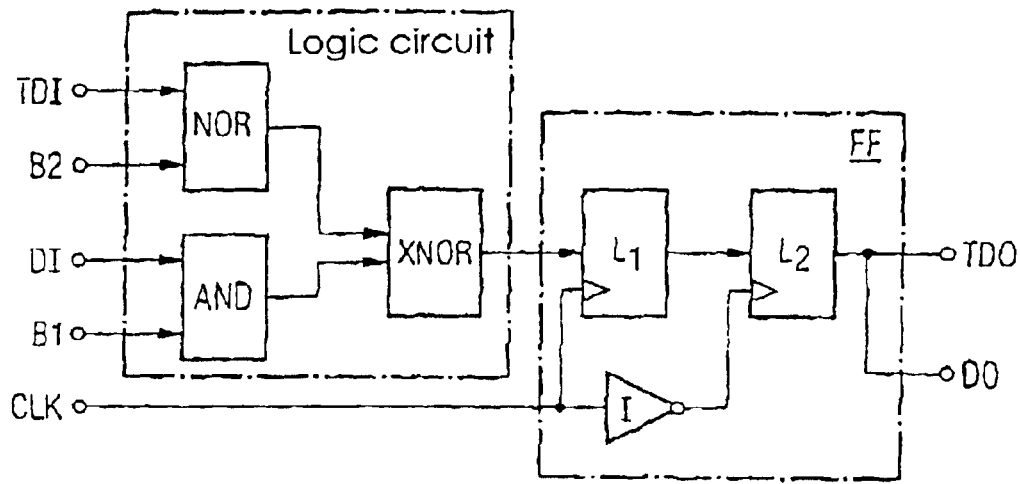
FIG. 2 is a schematic block diagram of a circuit cell for the serial construction of a BILBO register according to the prior art.
Figure 3:
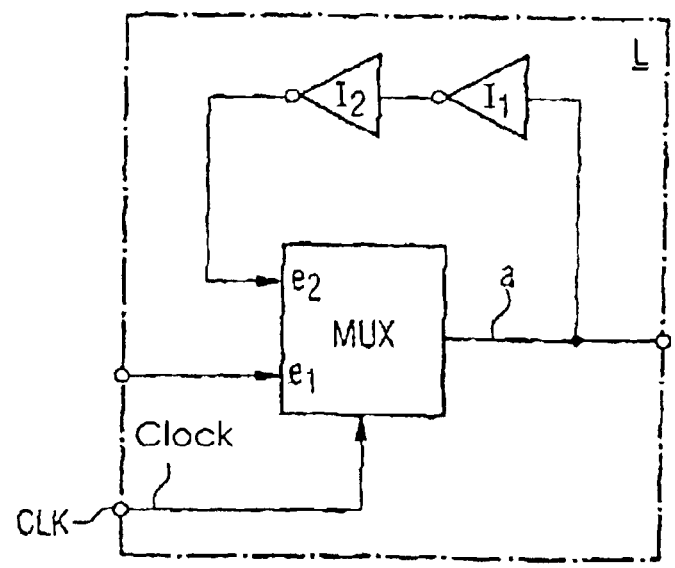
FIG. 3 is a schematic block diagram of the internal circuit construction of a latch circuit according to the prior art.
Figure 4:
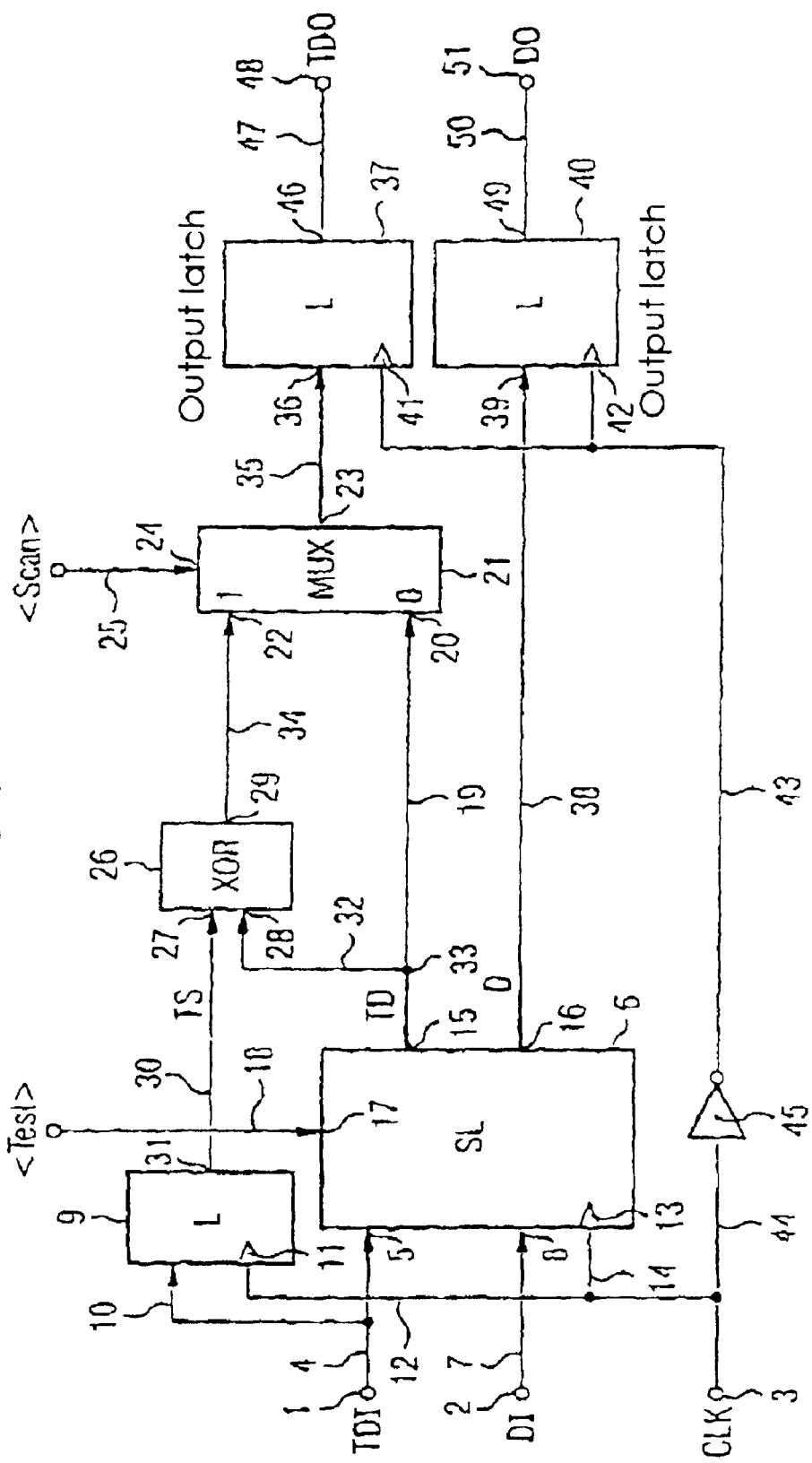
FIG. 4 is a schematic block diagram of a preferred embodiment of the circuit cell according to the invention.

A preferred embodiment of the invention's circuit cell 1 for the test pattern generation and test pattern compression of integrated circuits with a built-in self-test function is illustrated in FIG. 4.

The circuit cell 1 according to the invention has a test data input terminal 1 for receiving a test data input signal TDI from a circuit cell connected upstream, a data input terminal 2 for applying a data input signal DI and a clock signal input 3 for applying one clock signal CLK. The test data input 1 is connected via an internal line 4 to a first signal input 5 of a test data coupling-in circuit 6. The data input terminal 2 is connected via an internal signal line 7 to a second signal input 8 of the test data coupling-in circuit 6. The circuit cell according to the invention furthermore has a test data input buffer store 9, which is connected via an internal signal line 10 to the test data input line 4. The test data input buffer store 9 is preferably a latch circuit. The test data input buffer store 9 serves for buffer-storing the test data input signal TDI present at the terminal 1. The test data input buffer store 9 has a clock signal input 11, which is connected to the clock signal input terminal 3 via an internal clock line 12 of the circuit cell. The test data coupling-in circuit 6 likewise has a clock signal input 13, which is connected via a clock signal line 14 to the clock signal input 3 of the circuit cell according to the invention.

The test data coupling-in circuit 6 has two data inputs, namely the test data input 5 for applying the test data input signal TDI from a circuit cell connected upstream and the data input 8 for applying the data input signal DI. The test data coupling-in circuit 6 furthermore has two data outputs, namely a test data output 15 for outputting an internal buffer-stored test data signal and a data output 16 for outputting a data signal buffer-stored in the test data coupling-in circuit 6. The test data coupling-in circuit 6 furthermore has a control terminal 17, to which a first control signal TEST is applied via a control line 18.

The internal construction of the test data coupling-in circuit 6 shown in FIG. 4 will be explained in detail below with reference to FIG. 5.

As is illustrated in FIG. 4, the buffer-stored test data output signal TD output at the test data output 15 of the test data coupling-in circuit 6 is fed via an internal data line 19 of the circuit cell to a first signal input 20 of a switching device 21. The switching device 21 is preferably a multiplexer with a first signal input 20, a second signal input 22 and a signal output 23, in which case, via a control terminal 24 of the switching device 21, a second control signal SCAN present on a control line 25 switches the switching device 21 in such a way that either the signal input 20 or the signal input 22 of the switching device 21 is connected to the signal output 23.

The circuit cell according to the invention furthermore has a logical comparison circuit 26 with a first logic signal input 27, a logic signal input 28 and a logic signal output 29. The logic signal input 27 of the logical comparison circuit 26 is connected via an internal line 30 to a signal output 31 of the test data input buffer store 9. The second logic signal input 28 of the logical comparison circuit 26 is connected via an internal line 32 to a branching-off node 33 of the data line 19 for receiving the data output signal TD of the test data coupling-in circuit 6. The logical comparison circuit 26 compares the test data input signal TS buffer-stored by the test data input buffer store 9 with the buffer-stored test data signal TD output by the test data coupling-in circuit 6 via the test data output 15 and generates a comparison signal at the comparison circuit output 29, which comparison signal is applied via an internal line 34 to the second signal input 22 of the switching device 21. The logical comparison circuit 26 is preferably formed by an XOR gate for logically XORing the buffer-stored test data input signal TS and the test data output signal TD output by the test data coupling-in circuit 6.

The signal output 23 of the switching device 21 is preferably connected via an internal line 35 to the signal input 36 of a test data output buffer store 37. The test data output buffer store 37 is preferably a clocked latch circuit. The data output 16 of the test data coupling-in circuit 6 outputs a buffer-stored data signal D via an internal data line 38 to a signal input 39 of a data output buffer store 40. The data output buffer store 40 is preferably a clocked latch circuit. The test data output buffer store 37 and the data output buffer store 40 each have clock signal input terminals 41, 42, which are connected to an internal clock signal line 43. The signal present at the clock signal terminal 3 of the circuit cell passes via an internal line 44 to an inverter circuit 45, which applies the inverted clock signal to the two clock signal terminals 41, 42 of the test data output buffer store 37 and of the data output buffer store 40. The test data output buffer store 37 has a signal output 46 which outputs the buffer-stored data output signal via an internal data output signal line 47 to a test data signal output 48 of the circuit cell. The data output buffer store 40 has a signal output 49 which is connected via an internal data signal output line 50 to a data signal output terminal 51 of the circuit cell.

Figure 5:
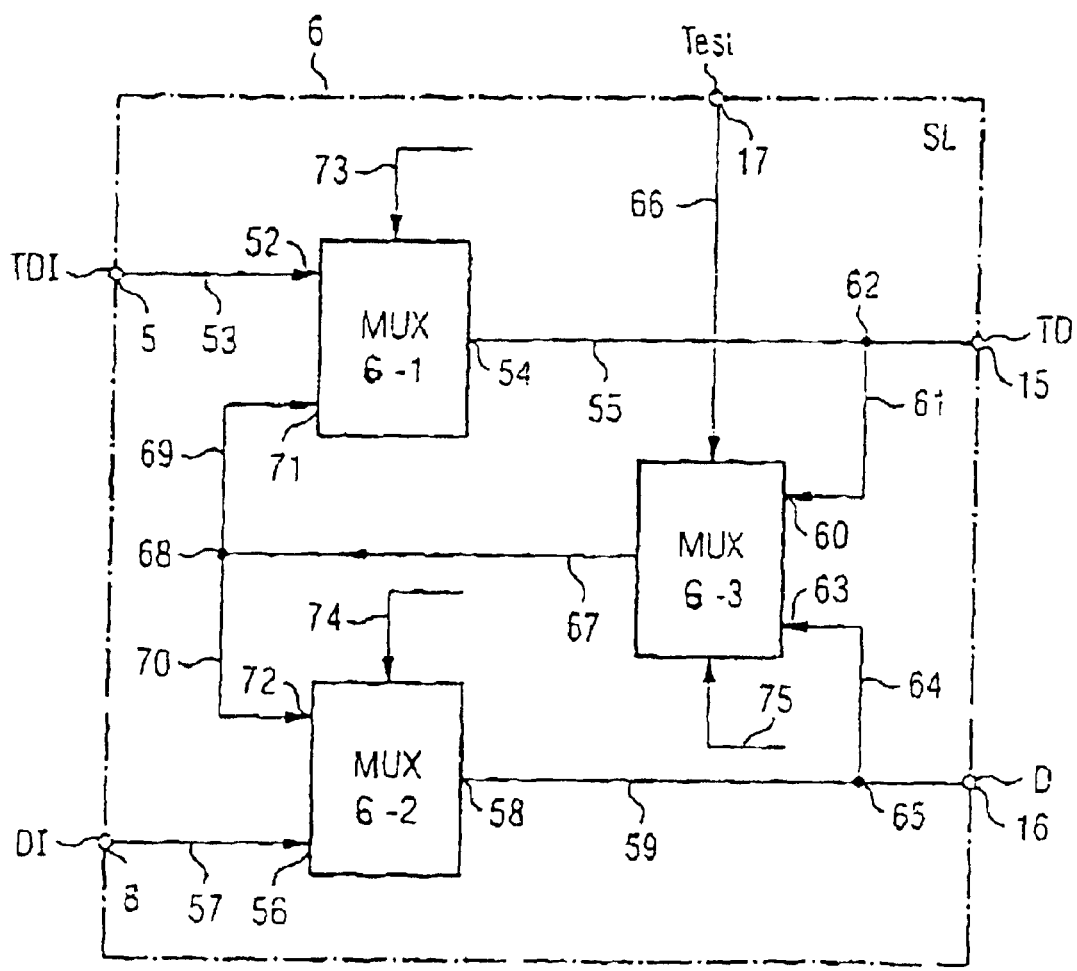
FIG. 5 is a schematic block diagram of the internal construction of a preferred embodiment of the test data coupling-in circuit according to the invention.

FIG. 5 shows the circuit construction of a preferred embodiment of the data coupling-in circuit 6 according to the invention. In the preferred embodiment of the test data coupling-in circuit 6 as shown in FIG. 5, provision is made of two signal buffer stores for buffer-storing the test data input signal present at the data input terminal 5 and the data input signal DI present at the input terminal 8. As can be seen from FIG. 5, the test data coupling-in circuit 6 contains three clocked multiplexers (6-1, 6-2, 6-3) each having two signal inputs and a signal output. The first signal input 52 of the first multiplexer 6-1 is connected to the test data signal input 5 via an internal line 53. The signal output 54 of the first multiplexer 6-1 is connected to the output terminal 15 of the test data coupling-in circuit 6 via an internal line 55. The first input 56 of the second multiplexer 6-2 is connected to the data input terminal 8 via an internal data line 57 and the signal output 58 of the second multiplexer 6-2 is connected to the data output 16 of the test data coupling-in circuit 6 via a line 59.

The third multiplexer 6-3 of the test data coupling-in circuit 6 has a first signal input 60, which is connected via a feedback line 61 to a branching-off node 62 of the data line 55, and also a second data input 63, which is connected via a feedback line 64 to a branching-off node 65 for feeding back the data signal D. The third multiplexer 6-3 is controlled by the first control signal TEST via an internal control line 66 of the test data coupling-in circuit 6. Depending on the first control signal present, either the test data signal TD present on the line 55 or the data signal D present on the line 59 is switched onto a feedback signal path 67, which branches at a branching node 68 to form a line 69 and a line 70. The branched feedback line 69 is connected to the second input 71 of the first multiplexer 6-1. The branched feedback line 70 is connected to the second input of the second multiplexer 6-2.

The multiplexers 6-1, 6-2, 6-3 are respectively connected via clock lines 73, 74, 75 to the clock signal input terminal 3—illustrated in FIG. 4—of the test data coupling-in circuit 6.

The first multiplexer 6-1 forms, together with the feedback multiplexer 6-3, a test data buffer store 6-1, 6-3 for buffer-storing the test data input signal TDI. The feedback multiplexer 6-3 simultaneously forms, with the second multiplexer 6-2, a data buffer store 6-2, 6-3 for buffer-storing the data input signal DI. The test data coupling-in circuit 6 shown in FIG. 5 thus has two integrated latch circuits, the first latch circuit being formed by the first multiplexer 6-1, which has feedback via the feedback multiplexer 6-3, and the second latch circuit being formed by the second multiplexer 6-2, which likewise has feedback via the feedback multiplexer 6-3. The two buffer stores of the test data coupling-in circuit 6 have a common feedback signal path 67, via which, in a manner dependent on the control signal TEST present in the line 66, the test data input signal received at the test data input terminal 5 can be coupled into the data signal path formed by the lines 57, 59. In the test data coupling-in circuit according to the invention, the feedback multiplexer fulfills a double function, namely, on the one hand, as part of the two buffer store circuits and, on the other hand, as a switching device for coupling the test data input signal into the data signal path. Furthermore, the test data can be read out via the feedback signal path 67.

The table below represents the signals of the circuit cell according to the invention for the different operating states:

signal inputs 1, 2 and two signal outputs 48, 51. A buffer store for storing the current signature is provided at the test data input 1 and a buffer store for buffer-storing the current datum is provided at the data input 8. A buffer store for buffer-storing the data output signal is situated at the data output terminal 51. At the test data output 48 there is a buffer store for buffer-storing a new signature or a test pattern according to a serial shift register operation. The logical comparison circuit 26 is preferably designed as an XOR circuit which is situated between the buffer store at the test data input 1, the data input 2 and the buffer store at the test data output 48. The circuit cell 1 according to the invention for test pattern generation and test pattern compression enables the compression of data with an already existing signature without altering the data on their path from the data input 2 to the data output 51.

The test data coupling-in circuit 6 can be used for reading in a new test pattern from the test data input 1 to the data output, which can couple test data into the data signal path via the feedback signal path 67 of the buffer stores using a multiplexer 6-3. This coupling-in is effected without additional signal propagation time delays in the data signal path between the test data input 1 and the memory cell data signal output 51.

The number of circuit elements required in the data signal path is minimal in the case of the circuit cell according to the invention, so that the switching speed of the circuit cell and of a register constructed from a plurality of these circuit cells is considerably increased.

The arrangement of the circuit cell according to the invention makes it possible to switch test data into the data path between the data input and the data output without altering the data path which is active in an operation mode. Furthermore, the test data are also read out by the feedback signal path. As a result, no additional fan-out loading of the data output is produced. This is particularly significant if the register circuit cells are positioned at a large distance from one another on the integrated circuit and, consequently, the signal line lengths are large and constitute a high capacitive load. The avoidance of the additional fan-out loading of the data output by the arrangement of the circuit cell according to the invention additionally avoids signal delays through a capacitive load on account of large line lengths between the circuit cells.

No limitation of the scope of the invention is intended by specific language used, and the invention should be construed to encompass all embodiments that would normally occur to one of ordinary skill in the art.

| Operating mode | TEST | SCAN | Clock | D | TD | TS | D | TDO |
|---|---|---|---|---|---|---|---|---|
| Normal mode | 0 | 0 | 0 | DI | TDI | TDI | $D0_{t-1}$ | $TDO_{t-1}$ |
|  | 0 | 0 | 1 | $D_{t-1}$ | $D_{t-1}$ | $TS_{t-1}$ | D | TD |
| Test data | 0 | 1 | 0 | DI | TDI | TDI | $D0_{t-1}$ | $TDO_{t-1}$ |
| compression | 0 | 1 | 1 | $D_{t-1}$ | $D_{t-1}$ | $TS_{t-1}$ | $D_{t-1}$ | TS $\oplus$ TD |
| Test data | 1 | 0 | 0 | DI | TDI | TDI | $D0_{t-1}$ | $TDO_{t-1}$ |
| generation/shift | 1 | 0 | 1 | $TD_{t-1}$ | $TD_{t-1}$ | $TS_{t-1}$ | D | TD |
| register mode |  |  |  |  |  |  |  |  |
| Reset/ | 1 | 1 | 0 | DI | TDI | TDT |  |  |
| initialization | 1 | 1 | 1 | $TD_{t-1}$ | $TD_{t-1}$ | $TS_{t-1}$ |  |  |

The circuit cell according to the invention can be changed over between a normal mode, a test data compression mode and a test data generation mode in a manner dependent on the two control signals TEST, SCAN. As can be seen from FIG. 4, the circuit cell according to the invention has two The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Furthermore, the present invention could employ any number of conventional techniques for electronics configuration, signal processing and/or control and the like.

The particular implementations shown and described herein are illustrative examples of the invention and are not intended to otherwise limit the scope of the invention in any way. Indeed, for the sake of brevity, conventional electronics, control systems, and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations of the invention will be readily apparent to those skilled in this art without departing from the spirit and scope of the present invention.

List of Reference Symbols

1 Test data signal input
2 Data signal input
3 Clock signal input
4 Line
5 Signal input of the test data coupling circuit
6 Test data coupling circuit (data coupling-in circuit)
6-1 First multiplexer
6-2 Second multiplexer
6-3 Third/Feedback multiplexer
6-1,6-3 Test data buffer store
6-2,6-3 Data buffer store
7 Line
8 Signal input
9 Test data input buffer store
10 Line
11 Clock input
12 Clock line
13 Clock input
14 Clock line
15 Test data output of the test data coupling circuit
16 Data output of the test data coupling-out circuit
17 Control terminal of the test data coupling-in circuit
18 Control line of the test data coupling-in circuit
19 Data line
20 Signal input of the switching device
21 Switching device
22 Signal input of the switching device
23 Signal output of the switching device
24 Control terminal of the switching device
25 Control line of the switching device
26 Comparison circuit
27 Signal input of comparison circuit
28 Signal input of the comparison circuit
29 Signal output of the comparison circuit
30 Line
31 Output of the test data input buffer store
32 Line
33 Branching node to the comparison circuit
34 Line
35 Line
36 Signal input of the test data output buffer store
37 Test data output buffer store
38 Line
39 Signal input of the data output buffer store
40 Data output buffer store
41 Clock input of the test data output buffer store
42 Clock input of the data output buffer store
43 Clock line
44 Clock line
45 Inverter
46 Output of the test data output buffer store
47 Line
48 Memory cell test data signal output
49 Output of the data output buffer store
50 Line
51 Circuit cell data signal output
52 First multiplexer first signal input
53 Internal line
54 First multiplexer signal output
55 Line
56 Second multiplexer first signal input
57 Line
58 Second multiplexer signal output
59 Line
60 Third multiplexer first signal input
61 Feedbackline
62 Branching-off node to third multiplexer
63 Multiplexer signal input
64 Feedback line for third multiplexer
65 Branching-off node to second multiplexer
66 Control line
67 Feedback signal path
68 Branching node to first and second multiplexer
69 Feedback line for first multiplexer
70 Feedback line for second multiplexer
71 First multiplexer second signal input
72 Second multiplexer second signal input
73 First multiplexer clock line
74 Second multiplexer clock line
75 Third multiplexer clock line

What is claimed is:

1. A circuit cell for data storage, test pattern generation and test pattern compression of circuits with a built-in self-test function, comprising:
a test data coupling-in circuit, comprising:
a test data buffer store;
a data buffer store;
a test data input for receiving a test data input signal from a circuit cell connected upstream, which signal can be stored in the test data buffer store;
a data input for applying a data input signal which can be stored in the data buffer store;
a test data output for outputting a buffer-stored test data signal; and
a data output for outputting a buffer-stored data signal to a data signal path via a data signal output of the circuit cell;
the test data buffer store and the data buffer store each comprising:
a multiplexer having a signal input and a signal output;
a feedback signal path; and
a feedback multiplexer having a first input, a second input, and an output, the feedback multiplexer being configured for feeding back the signal output via the feedback signal path to the signal input of the multiplexer and the received test data input signal being coupled into the data signal path via the feedback signal path in a manner dependent on a first control signal applied to the test data coupling-in circuit;

the circuit cell for data storage further comprising:

a test data signal output;

a switching device; and a logical comparison circuit, configured to compare the test data input signal with the test data signal output by the test data coupling-in circuit and configured to generate a comparison signal which is applied to the switching device which, in a manner dependent on a second control signal, switches through at least one of the generated comparison signal and the test data signal output by the test data coupling-in circuit to the test data signal output of the circuit cell, the feedback multiplexer configured to be controlled by the first control signal, enabling at least one of the test data signal and the data signal to be switched onto the feedback signal path.

2. A circuit cell according to claim 1 wherein:

the feedback multiplexer comprises a first signal input and a second signal input;

the first signal input of the feedback multiplexer being connected to the signal output of the multiplexer of the test data buffer store;

the second signal input of the feedback multiplexer being connected to the signal output of the multiplexer of the data buffer store;

the feedback multiplexer is configured to be controllable by the first control signal in such a way that the signal output of the multiplexer of the test data buffer store is switched to a signal input of the multiplexer of the data buffer store for coupling in the test data.

3. A circuit cell according to claim 1, wherein the multiplexer of the test data buffer store comprises a first switchable signal input and a second switchable signal input, the test data input signal being present at the first signal input of the multiplexer of the test data buffer store and the second signal input of the multiplexer of the test data buffer store being connected to the feedback multiplexer output.

4. A circuit cell according to claim 1, wherein the multiplexer of the data buffer store comprises a first switchable signal input and a second switchable signal input, the data input signal being present at the first signal input of the multiplexer of the data buffer store and the second signal input of the multiplexer of the data buffer store being connected to the feedback multiplexer output.

5. A circuit cell according to claim 1, wherein the logical comparison circuit is an XOR gate.

6. A circuit cell according to claim 1, wherein the switching device is a multiplexer.

7. A circuit cell according to claim 1, further comprising:

a clocked data output buffer store between the data output of the test data coupling circuit and the data signal output of the circuit cell.

8. A circuit cell according to claim 7, wherein the clocked data output buffer store is formed by a latch circuit containing a feedback multiplexer.

9. A circuit cell according to claim 1, further comprising:

a clocked test data output buffer store between the test data signal output of the circuit cell and the switching device.

10. A circuit cell according to claim 9, wherein the clocked test data output buffer store is formed by a latch circuit containing a feedback multiplexer.

11. A circuit cell according to claim 1, further comprising:

a clock input signal of the test data coupling-in circuit for clocking the multiplexers of the test data coupling-in circuit provided to a clock input of the test data coupling-in circuit.

12. A circuit cell according claim 1, further comprising:

a clock input signal of the circuit cell that is in that is inverted with respect to the clock input signal of the test data coupling-in circuit and is connected to a clock input of the data output buffer store and a clock input of the test data output buffer store.

13. A circuit cell according to claim 1, further comprising:

a clocked test data input buffer store configured to store the test data input signal for comparison with the test data signal by the logical comparison circuit.

14. A circuit cell according to claim 13, wherein the clocked test data input buffer store is formed by a latch circuit containing a feedback multiplexer.

15. A circuit cell according to claim 1, configured so that data storage and test pattern compression are effected simultaneously, and the stored data remains unchanged.

16. A Built In Logic Block Observation (BILBO) comprising:

a circuit cell according to claim 1; and a further circuit cell according to claim 1, wherein the test data signal output of the circuit cell is connected to test data input of the further circuit cell.

* * * * *